United States Patent [19]

Colquhoun et al.

[11] 4,438,445
[45] Mar. 20, 1984

[54] VARIABLE CAPACITANCE DIODE AND METHOD OF MAKING THE SAME

[75] Inventors: Alexander Colquhoun, Heilbronn-Sontheim, Fed. Rep. of Germany; Erhard Kohn, Ithaca, N.Y.

[73] Assignee: Telefunken Electronic GmbH, Heilbronn, Fed. Rep. of Germany

[21] Appl. No.: 281,468

[22] Filed: Jul. 8, 1981

[30] Foreign Application Priority Data

Jul. 30, 1980 [DE]  Fed. Rep. of Germany ....... 3028820

[51] Int. Cl.³ ...................... H01L 29/92; H01L 29/48
[52] U.S. Cl. ...................................... 357/14; 357/15; 357/89
[58] Field of Search ................... 357/14, 15 V, 90, 15, 357/89

[56] References Cited

U.S. PATENT DOCUMENTS

| 3,915,765 | 10/1975 | Cho et al. ............................ 148/175 |
| 4,226,648 | 10/1980 | Goodwin et al. ................. 357/14 X |
| 4,250,514 | 2/1981 | Raabe .................................... 357/14 |

FOREIGN PATENT DOCUMENTS

| 2429634 | 1/1975 | Fed. Rep. of Germany . |
| 2833318 | 2/1980 | Fed. Rep. of Germany . |
| 1450954 | 9/1976 | United Kingdom .................. 357/14 |

OTHER PUBLICATIONS

Fujimoto et al., "Gallium Arsenide Diffused Diode, ECL-2172", *Rev. Electrical Comm. Lab.* vol. 18, No. 9-10, pp. 632-637, Sep.-Oct. 1970.

Jackson et al., "Hyperabrupt Epitaxial Tuning Diodes" *Solid State Electronics*, vol. 20, No. 6, pp. 485-490, Jun. 1977.

Kumar et al., Variability Study and Design Considerations of Hyperabrupt Junction Voltage Variable Capacitors, Solid-State Electronics, 1976, vol. 19, pp. 519-525.

*Primary Examiner*—Martin H. Edlow
*Assistant Examiner*—J. L. Badgett
*Attorney, Agent, or Firm*—Spencer & Frank

[57] ABSTRACT

A variable capacitance diode comprises a low resistance semi-conductor substrate on which is epitaxially deposited three layers, a first layer adjacent the substrate having an impurity concentration which decreases towards the substrate, a very thin intermediate region and a relatively thin surface region of lower doping than the intermediate region, a barrier being formed on or in the outer surface of the relativey thin surface region.

The invention also includes a method of making such a diode.

17 Claims, 2 Drawing Figures

VARIABLE CAPACITANCE DIODE AND METHOD OF MAKING THE SAME

BACKGROUND OF THE INVENTION

The invention relates to a variable capacitance diode comprising a low resistance semiconductor substrate and an epitaxial layer arranged thereon with an impurity concentration which decreases towards the semiconductor substrate and with a barrier layer arranged in or on the epitaxial layer and opposite the semiconductor substrate.

Variable capacitance diodes are used to tune the frequency of resonant circuits for the UHF range for example. They are intended to have a low series resistance and a fixed C(U) characteristic and produce a constant tuning amplitude in the resonant circuit. The curve of capacitance over the applied D.C. voltage and the series resistance of the variable capacitance diode depend to a large extend on the doping profile in that part of the diode in which the space charge region extends when voltage is applied, this voltage being across the barrier layer in the reverse direction.

SUMMARY OF THE INVENTION

It is an object of the invention to provide a variable capacitance diode which has a very precisely fixed curve of capicitance over the applied D.C. reverse voltage. Moreover the diode is intended to have a very high breakdown voltage and a low series impedance.

According to a first aspect of the invention, there is provided a variable capacitance diode comprising a low resistance semi-conductor substrate, an epitaxial layer arranged on said semi-conductor substrate, a barrier associated with said epitaxial layer and spaced from said semiconductor substrate, a relatively thin surface region of said epitaxial layer directly adjacent said barrier layer and a very thin intermediate region of higher doping than said relatively thin surface region and said intermediate region adjoining said relatively, thin surface on one side and the remainder of said epitaxial layer, which has an impurity concentration which decreases towards the substrate, on the other side.

Further according to this aspect of the invention, there is provided a variable capacitance diode comprising a low resistance semi-conductor substrate, an epitaxial layer which is arranged thereon and a barrier layer arranged in or on the surface of the epitaxial layer opposite the surface adjoining the semi-conductor substrate, and wherein the epitaxial layer has a relatively thin surface region which is arranged directly beneath the barrier layer and is less heavily doped than an adjoining very thin intermediate region, and a further region which has an impurity concentration which decreases towards said semi-conductor substrate adjoins the thin intermediate region.

According to a second aspect of the invention, there is provided a method of producing a variable capacitance diode comprising, epitaxially depositing on a low resistance semi-conductor substrate a first semi-conductor layer having an impurity concentration which decreases towards said semi-conductor substrate, epitaxially depositing on said first semi-conductor layer a second semi-conductor layer in the form of a very thin intermediate region, epitaxially depositing on said second semi-conductor layer a third semi-conductor layer in the form of a relatively thin surface region of a lower doping than said second semi-conductor layer, and forming a barrier layer adjacent to said third semi-conductor layer.

BRIEF DESCRIPTION OF THE DRAWINGS

The invention will now be described in greater detail, by way of an example, with reference to the drawings, in which.

DESCRIPTION OF THE PREFERRED EMBODIMENT

In a preferred embodiment of the invention is a variable capacitance diode of the type described at the outset, a relatively thin semiconductor surface region is arranged directly beneath the barrier layer in the epitaxial layer, with said relatively thin semi-conductor surface region being less heavily doped than a very thin intermediate semiconductor region adjoining it and with the semi-conductor region with an impurity concentration which decreases towards the semiconductor substrate adjoining the thin intermediate region.

With a certain predetermined voltage value, the capacitance may be stabilized at a fixed and predetermined value by means of the intermediate semiconductor region lying inside the semiconductor member and fairly heavily doped. The C(U) characteristic may be fixed so as to be reproducible in connection with the fixed value in this way. The capacitance value of the varactor diode which is fixed by the thickness of the surface region and is stabilized by the intermediate region at a predetermined voltage range depends on the particular application intended. For example, in a UHF resonance circuit in which the tuning range is between 3 and 28 V, it is possible to stabilize the capacitance associated with a varactor voltage of 3 volts. This is important because the C(U) characteristic falls steeply in the voltage range beneath the tuning limit in conventional varactors and therefore it is not easy to set a fixed starting value for the capacitance at the lower tuning limit. The field strength at the surface is reduced because of the intermediate region. As a result higher breakdown voltages can be achieved even when the properties of the diode are otherwise comparable.

The barrier layer of the variable capacitance diode is preferably formed by a rectifying metal/semiconductor junction which is in many cases designated as a Schottky contact. In particular, gallium arsenide is suitable as a semiconductor material since the mobility of the charge carriers is high in this material. The net impurity concentration in the epitaxial layer starts to drop from the intermediate region and continues as far as the semiconductor substrate. With a different advantageous refinement, the net impurity concentration in the epitaxial layer region adjoining the intermediate region only falls to a certain value and then remains constant up to the semiconductor substrate. The portion of the epitaxial layer ajoining the semiconductor substrate is therefore lower in resistance, so that the series impedance of the variable capacitance diode as a whole is reduced. The impurity profile is selected so that the desired tuning characteristics of the resonance circuit are achieved, whereby it is important to have very good linearity of the frequency as a function of the varactor voltage.

Figure 1:
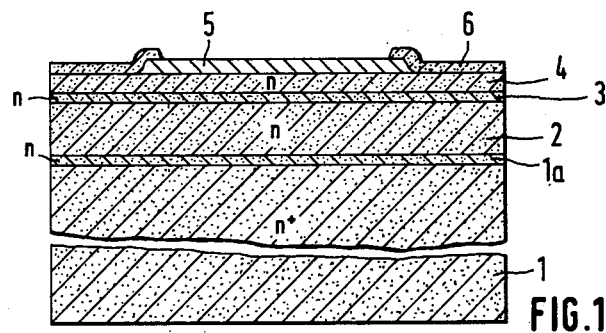
FIG. 1 shows the construction of a variable capacitance diode in accordance with the invention in the form of layers.

Referring now to FIG. 1, a semiconductor substrate 1 comprises n+ doped gallium-arsenide for example of a thickness of 200 to 400 μm for example. The impurity concentration of the base member 1 amounts to approximately $10^{18}$ atoms/cm$^3$.

Several layers 2 to 4 are applied one after another to this heavily doped substrate 1 by epitaxial deposition. These layers may be produced by means of gas-phase epitaxy or molecular beam epitaxy in one operation by varying the deposition parameters. If necessary it may be advisable to insert a so called buffer layer 1a between the highly doped substrate 1 and the epitaxially deposited semiconductor layer 2, with the impurity concentration in the layer 1a being between that of the substrate 1 and that of the epitaxial layer 2. This is how an excessively large amount of impurity is prevented from being diffused out of the substrate 1 into the epitaxial layers during epitaxial layer deposition. The buffer layer 1a is several μm thick, for example, and has an impurity concentration in the region of between $10^{17}$–$10^{18}$ atoms/cm$^3$.

Figure 2:
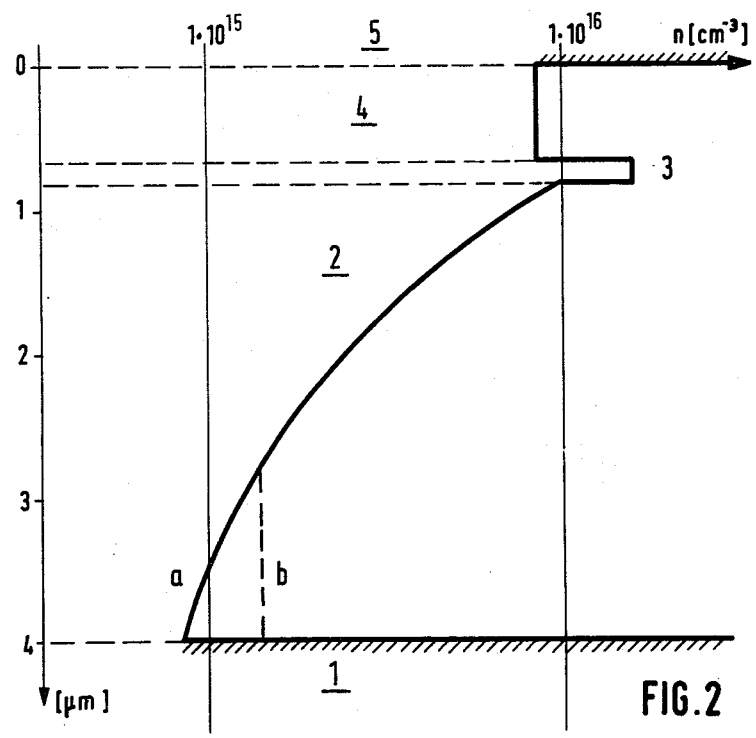
FIG. 2 shows the curve of the net impurity concentration by means of a cross section through the semiconductor member in accordance with FIG. 1.

The epitaxial layer 2 arranged on the buffer layer 1a is approximately 3 μm thick for example and has an impurity concentration which increases from the substrate 1 or the buffer layer 1a. The impurity concentration curve in layer 2 is apparent from FIG. 2. FIG. 2 does not take account of the impurity concentration of the buffer layer 1a. The lowest doping in the epitaxial layer 2 is directly at the junction with the highly doped substrate 1. In one embodiment, the impurity concentration at this point is approximately $10^{15}$ atoms/cm$^3$ and then increases continuously up to the intermediate layer 3 to a value of approximately $10^{16}$ atoms/cm$^3$ in accordance with the curve of FIG. 2. In another preferred embodiment the impurity concentration in the layer 2, starting from the semiconductor substrate 1 or the buffer layer 1a is constant initially and in a layer thickness of approximately 1 μm, for example, amounts to $2.10^{15}$ atoms/cm$^3$. The impurity concentration in the layer 2 then increases continuously up to the stated value at the edge of the intermediate region 3. The continuously increasing impurity concentration curve is designated a in FIG. 2 whereas the path having constant doping initially is shown as the function b. The doping curve according to curve b has the advantage that the series impedance is reduced by the slightly greater doping near the semiconductor base member.

The curve for the impurity concentration in the layer 2 largely determines the capacitance/voltage curve of the varactor diode, since the capacitance of the diode arises from the respective expanse of the space charge region in dependence on the applied reverse voltage. However a thin intermediate region 3 adjoins the semiconductor region 2 and its average impurity concentration is greater than that of the semiconductor region 2 and than that of the adjoining surface region 4. The intermediate semiconductor region which is also produced by epitaxial deposition is only 0.05 to 0.02 μm thick for example. The impurity concentration amounts to approximately $5.10^{16}$ atoms/cm$^3$. The doping in the intermediate region 3 is preferably a sharp peak or a dirac-function. The region is intended to be as narrow as possible with a fixed integral value made up of the doping and the thickness, and the doping is intended to be as large as possible in order to achieve optimum association between a fixed voltage and a stable capacitance value.

The surface region 4 runs from the intermediate region 3 to the surface of the semiconductor substrate, is approximately 0.5 to 1 μm thick and has a substantially constant impurity concentration, or and impurity concentration which falls towards the surface, of approximately $10^{16}$ atoms/cm$^3$ or less. Owing to the combination of the surface region 4 with the intermediate region 3, the capacitance is stabilized at a set value and reduces the surface field strength. The space charge region hits the intermediate region 3 at a low reverse voltage and then broadens out only slowly across the highly doped and thin intermediate layer 3. In this region the capacitance is almost independent of the reverse voltage and therefore can be set exactly. The following capacitance/voltage characteristic may be set very precisely with the layer type construction of the varactor diode provided in accordance with the invention.

All of the layers of the n-conductive gallium-arsenide semiconductor member in accordance with FIG. 1 are doped preferably with sulphur. There is another metal layer 5 on the surface region 4, which forms a rectifying metal/semiconductor junction or Schottky junction with the surface layer 4. Alluminium, platinum or titanium/tungsten alloys may be considered by way of example as suitable metals. The surface of the semiconductor may be covered with a passivating layer 6 comprising silicon dioxide for example. The Schottky contact 5 could be replaced, of course, by a p+ layer in which case the varactor diode would be a varactor diode with a pn junction.

It will be understood that the above description of the present invention is susceptible to various modifications changes and adaptations.

What is claimed is:

1. A variable capacitance diode comprising a low resistance semiconductor substrate, and epitaxial layer arranged on said semiconductor substrate, and a barrier layer arranged in or on the major surface of said epitaxial layer opposite the major surface adjoining said semiconductor substrate; and wherein said epitaxial layer includes a relatively thin surface region which extends directly beneath the barrier layer and which is less heavily doped than an adjoining very thin intermediate region, and a further region which extends from said intermediate region to said substrate and has an impurity concentration which decreases towards said semiconductor substrate.

2. A variable capacitance diode as defined in claim 1, wherein the impurity concentration in said further region decreases continuously towards said semiconductor substrate.

3. A variable capacitance diode as defined in claim 1, wherein the impurity concentration in said further region decreases continuously to a certain value and then remains constant in the remaining portion of said further region which extends to said semiconductor substrate.

4. A variable capacitance diode as defined in claim 1, wherein said barrier layer comprises a rectifying metal/semiconductor junction.

5. A variable capacitance diode as defined in claim 1, wherein said relatively thin surface region is approximately 0.5 to 1 μm thick.

6. A variable capacitance diode as defined in claim 1, wherein said intermediate region is approximately 0.05 to 0.2 μm thick.

7. A variable capacitance diode as defined in claim 1, wherein the semiconductor body comprising said substrate, and said epitaxial layer comprises n-conducting Ga As.

8. A variable capacitance diode as defined in claim 1, wherein the said relatively thin surface region has an impurity concentration of less than $10^{16}$ atoms/cm$^3$ and said intermediate region has an impurity concentration of approximately $2-5\times10^{16}$ atoms/cm$^3$.

9. A variable capacitance diode as defined in claim 2, wherein said further region has an impurity concentration of approximately $10^{15}-5\cdot10^{15}$ atoms/cm$^3$ at said semiconductor substrate.

10. A variable capacitance diode as defined in claim 1 wherein said intermediate region has an impurity concentration which is greater than the maximum impurity concentration of said further region.

11. A variable capacitance diode as defined in claim 1 wherein said further region has an impurity concentration which decreases from approximately $10^{16}$ atoms/cm$^3$ adjacent said intermediate region to approximately $10^{15}-5\cdot10^{15}$ atoms/cm$^3$ adjacent said substrate.

12. A variable capacitance diode comprising: a low resistance semiconductor substrate; a first semiconductor epitaxial layer of one conductivity type disposed on said substrate and having an impurity concentration which decreases toward said substrate; a very thin second semiconductor epitaxial layer of said one conductivity type disposed on said first epitaxial layer and having a constant impurity concentration which is greater than that of said first epitaxial layer; a third relatively thin semiconductor epitaxial layer of said one conductivity type disposed on said second layer and having an impurity concentration which is less than that of said second layer; and means disposed in or on the surface of said third layer for forming a barrier layer with said third layer.

13. A variable capacitance diode as defined in claim 12 wherein: said first layer has an impurity concentration which decreases from approximately $10^{16}$ atoms/cm$^3$ to approximately $1-5\cdot10^{15}$ atoms/cm$^3$; said second layer has an impurity concentration of approximately $2-5\times10^{16}$ atoms/cm$^3$; and said third layer has an impurity concentration slightly less than $10^{16}$ atoms/cm$^3$.

14. A variable capacitance diode as defined in claim 13 wherein said second layer is approximately 0.05 to 0.2 $\mu$m thick and said third layer is approximately 0.5 to 1 $\mu$m thick.

15. A variable capacitance diode as defined in claim 14 wherein said impurity concentration in said first layer decreases continuously toward said substrate.

16. A variable capacitance diode as defined in claim 14 wherein said impurity concentration in said first layer decreases continuously towards said substrate in a certain portion of said first layer adjacent said second layer and then remains constant throughout the remaining portion of said first layer.

17. A variable capacitance diode as defined in claim 14 wherein said means forming said barrier layer comprises a metal layer disposed on said surface of said third layer and forming a rectifying metal/semiconductor junction with said third layer.

* * * * *